United States Patent [19]

McMahon

[11] Patent Number: 5,362,656
[45] Date of Patent: Nov. 8, 1994

[54] METHOD OF MAKING AN ELECTRONIC ASSEMBLY HAVING A FLEXIBLE CIRCUIT WRAPPED AROUND A SUBSTRATE

[75] Inventor: John F. McMahon, Phoenix, Ariz.

[73] Assignee: Intel Corporation, Santa Clara, Calif.

[21] Appl. No.: 228,095

[22] Filed: Apr. 15, 1994

Related U.S. Application Data

[62] Division of Ser. No. 985,175, Dec. 2, 1992.

[51] Int. Cl.⁵ .................... H01L 21/56; H01L 21/60
[52] U.S. Cl. ..................................... 437/21; 437/209; 257/709; 257/781; 361/749
[58] Field of Search .............. 174/254, 255, 52.4, 174/261; 257/688, 692–700, 758–760, 672, 673, 676, 684, 685, 686; 361/749, 761; 439/67, 77; 29/827; 228/180.21, 180.22, 180.50; 437/205, 208, 209, 212, 220, 206, 207, 915

[56] References Cited

U.S. PATENT DOCUMENTS

| 4,885,126 | 12/1989 | Polonio | 361/399 |
| 4,912,547 | 3/1990 | Bilowith et al. | 357/80 |
| 5,162,265 | 11/1992 | Roth | 437/206 |
| 5,202,622 | 4/1993 | Cole et al. | 324/158 |
| 5,229,916 | 7/1993 | Frankeny et al. | 361/386 |
| 5,278,724 | 1/1994 | Angulas et al. | 361/707 |

FOREIGN PATENT DOCUMENTS

| 0041054 | 2/1988 | Japan | 437/215 |
| 0239651 | 9/1990 | Japan | 437/208 |

Primary Examiner—Olik Chaudhuri
Assistant Examiner—Long Pham
Attorney, Agent, or Firm—Blakely, Sokoloff, Taylor & Zafman

[57] ABSTRACT

An electronic package assembly that includes a flexible circuit wrapped around a metal substrate. The leads of the flexible circuit are connected to an integrated circuit that is mounted to the top surface of the substrate. The flexible circuit has a plurality of metal pads located adjacent to the bottom surface of the substrate. The flexible circuit also contains a power/ground plane and a number of conductive signal lines that couple the integrated circuit to the metal pads. The pads can be soldered to a printed circuit board to electrically couple the integrated circuit to the board.

8 Claims, 2 Drawing Sheets

METHOD OF MAKING AN ELECTRONIC ASSEMBLY HAVING A FLEXIBLE CIRCUIT WRAPPED AROUND A SUBSTRATE

This is a division of application Ser. No. 07/985,175, filed Dec. 2, 1992.

BACKGROUND OF THE INVENTION

1. Field of the Invention

The present invention relates to an electronic package assembly.

2. Description of Related Art

Electronic packages typically include an integrated circuit that is encapsulated in a plastic or ceramic housing. The housing has a plurality of wire leads or pads that are coupled to the circuit. The package is typically mounted to a printed circuit board by soldering the leads/pads to corresponding pads or plated through holes in the board.

Integrated circuits generate heat which flows into the housing. The heat is removed from the package primarily by convection from the housing, or conduction into the circuit board through the leads/pads. Plastic and ceramic are relatively poor thermal conductors, wherein the heat can create high junction temperatures in the circuit. It is therefore desirable to provide an electronic package assembly that is thermally efficient in removing heat generated by an internal electrical device.

Electronic packages are typically constructed with internal signal lines that are parallel with each other. When used with a high speed circuit, parallel lines can produce cross-talk and other electrical noise in the signals. It is therefore desirable to have an electronic package that minimizes the amount of electrical noise in a signal that travels through the package. Additionally, it is also desirable to have an electronic package assembly which maximizes the lead density of the package and the input/output (I/O) of the integrated circuit.

SUMMARY OF THE INVENTION

The present invention is an electronic package assembly that includes a flexible circuit wrapped around a metal substrate. The leads of the flexible circuit are connected to an integrated circuit that is mounted to the top surface of the substrate. The flexible circuit has a plurality of metal pads located adjacent to the bottom surface of the substrate. The flexible circuit also contains a power/ground plane and a number of conductive signal lines that couple the integrated circuit to the metal pads. The metal pads are typically soldered to a printed circuit board, so that the integrated circuit is coupled to the board.

The flexible circuit may have multiple layers of signal lines that are interconnected to reduce the amount parallelism and cross-talk between the lines. The substrate is typically constructed from a metal such as copper which reduces the overall thermal resistance of the package. The assembly may also be constructed so that the substrate functions as a power/ground plane. The metal pads typically would fully populate the bottom surface of the substrate, so that the package has a maximum number of contacts.

Therefore it is an object of the present invention to provide an electronic package assembly that is thermally efficient in removing heat from an integrated circuit.

It is also an object of the present invention to provide an electronic package assembly that reduces the amount of electrical noise in the signal lines of the package.

It is also an object of the present invention to provide an electronic package assembly that utilizes an optimum amount of leads.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
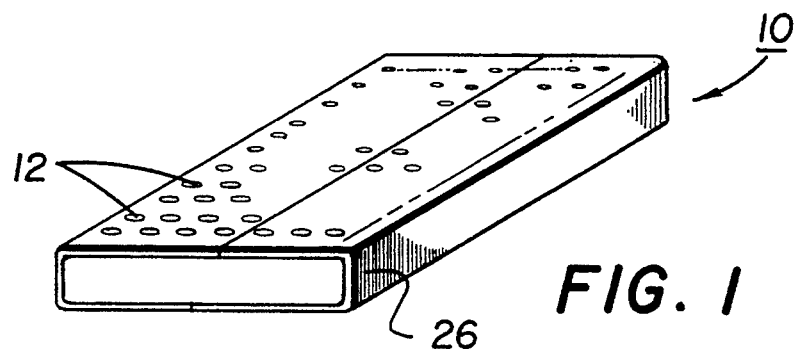
FIG. 1 is a perspective view of an electronic package of the present invention.

Referring to the drawings more particularly reference numbers, FIG. 1 shows an electronic package assembly 10 of the present invention. The assembly 10 has a plurality of pads 12 that can be soldered to a printed circuit board (not shown). The circuit board typically contains a number of assemblies 10 that communicate through the board. The pads 12 are preferably arranged in a grid like pattern to maximize the pin density of the package 10.

Figure 2:
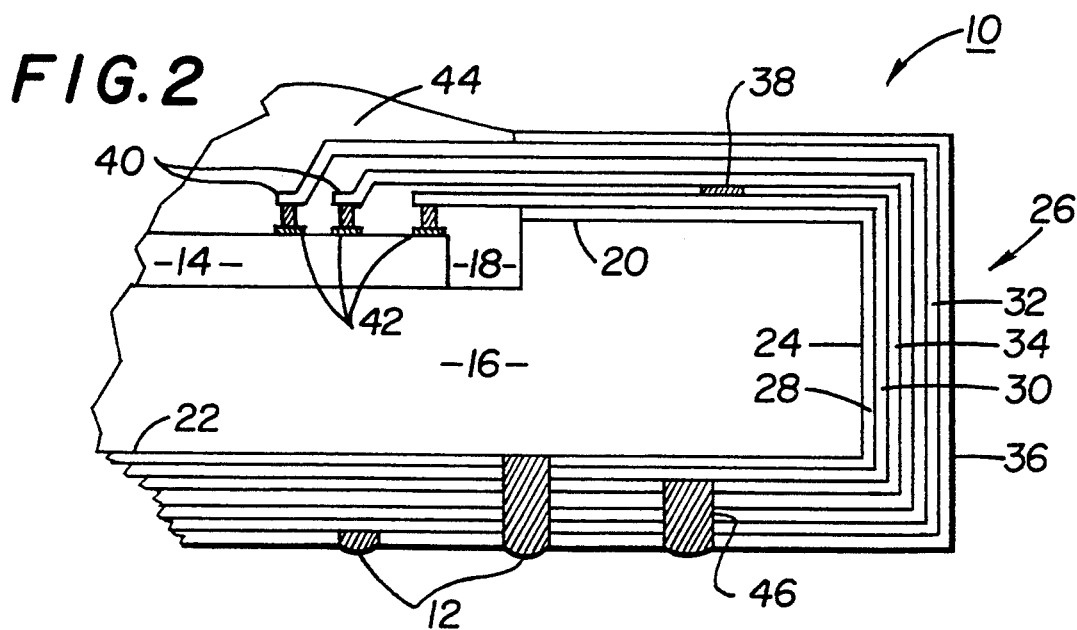
FIG. 2 is a cross-sectional view of the electronic package of FIG. 1.
Figure 3:
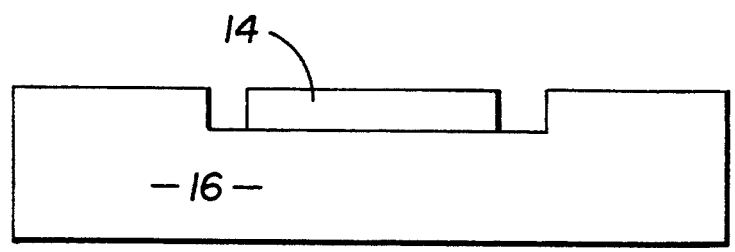
FIG. 3 is a side view of an integrated circuit mounted to a substrate.
Figure 4:
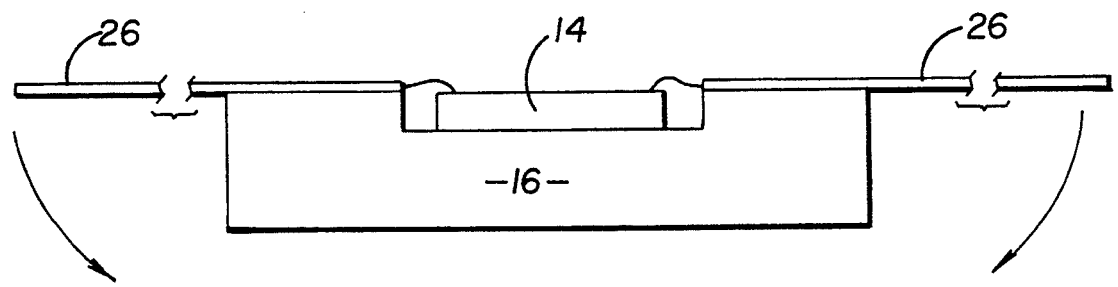
FIG. 4 is a view similar to FIG. 3 showing a pair of flexible circuits attached to the integrated circuit and bonded to a top surface of the substrate.
Figure 5:
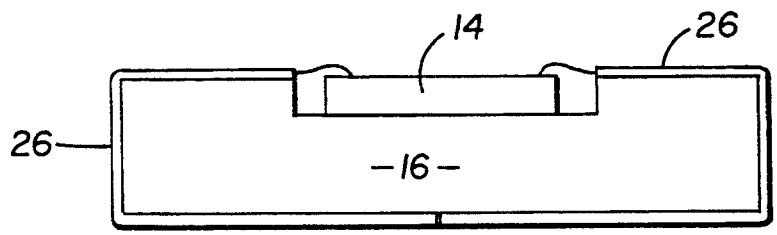
FIG. 5 is a view similar to FIG. 4, showing the flexible circuits wrapped around the substrate.
Figure 6:
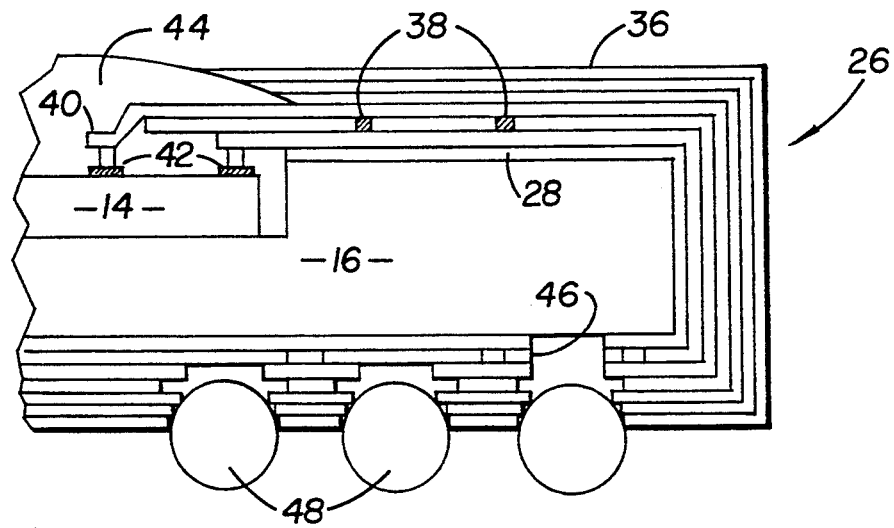
FIG. 6 is a view similar to FIG. 5, showing a plurality of solder preforms that are then reflowed into metal pads in the flexible circuits.

As shown in FIG. 2, the package 10 includes an electrical device 14 which is typically an integrated circuit (IC) that contains logic, memory, etc., as is known in the art. The device 14 is mounted to a substrate 16 and located within a cavity 18 formed in the top surface 20 of the substrate 16. The substrate 16 also has a bottom surface 22 and a pair of side surfaces 24.

The package 10 includes a flexible circuit 26 that wraps around the substrate 16. The flexible circuit 26 may include a first layer of dielectric material 28 that separates the substrate 16 from a layer of conductive signal lines 30. The dielectric material is preferably constructed from a polyimide that is flexible enough to bend around the substrate 16. The conductive signal lines 30 are typically copper lines etched in a predetermined pattern. The flexible circuit 26 usually has a plurality of signal lines that transmit digital signals from the IC 14 to the printed circuit board.

The conductive signal lines 30 are typically separated from an outer conductive plane 32 by a second layer of dielectric 34. The conductive plane 32 can be used as either a power or ground plane for the integrated circuit 14. The conductive plane 32 is preferably covered by an outer layer of dielectric material 36. The flexible circuit 26 may have additional layers of signal lines and power/ground planes separated by layers of dielectric. The flexible circuit 26 may also include vias 38 that interconnect the different conductive signal lines and/or the conductive planes. The signal lines 30 may be constructed so that no two signal lines run parallel along the entire length of the flexible circuit 26. Such a construction reduces the inductance and capacitance of the circuit and the amount of electrical noise between the lines. Controlling the impedance of the circuit 26 is particularly important for high speed chips 14.

The flexible circuit 26 has a plurality of leads 40 that extend from the signal lines 30 and power plane 32. The leads 40 are bonded to pads 42 on the surface of the device 14. Both the device 14 and the cavity 18 are covered with a dielectric material 44. The dielectric material 44 is preferably a plastic typically used to encapsulate electrical devices.

The pads 12 extend from the signal lines 30 and power/ground plane 32. The pads 12 couple the device 14 to the printed circuit board through the signal lines 30 and power/ground plane 32 of the flexible circuit 26. The substrate 16 is preferably constructed from a metal such as copper which is both electrically and thermally conductive. The substrate 16 may also function as a power/ground plane, wherein a plurality of pads 12 are coupled to the substrate 16. The power/ground pads 12 also provide a thermal path for heat to flow from the substrate 16 to the circuit board. The high thermal conductivity of the copper substrate 16 greatly reduces the temperature differential throughout the package 10 and the junction temperatures of the discrete elements on the device 14. The power/ground pads and signal pads both extend through holes 46 formed in the power/ground plane 32 and dielectric layers. The holes 46 typically contain a dielectric material between the power/ground plane 32 and the pads 12 to prevent shorting between the two conductive members.

FIGS. 3-6 show a preferred method of constructing the package assembly 10 of the present invention. The substrate 16 is covered with a layer of polyimide 28 that has a layer of adhesive on both sides of the dielectric material 28. The polyimide 28 covers the areas of the substrate 16 that will be adjacent to the signal lines 30 and conductive plane 32 of the flexible circuit 26. If the substrate 16 is to be used as a power/ground plane, via holes 46 can be drilled, punched or etched into the polyimide 28 before the dielectric is attached to the substrate 16.

The device 14 is mounted to the cavity 18 of the substrate 16 by techniques known in the art. A single flexible circuit 26 containing the signal lines 30 and conductive plane 32 can then be wrapped around the substrate 16, so that the leads 40 of the circuit 26 are aligned with the surface pads of the device 14. The circuit 26 can then be bonded to the substrate 16 in an autoclave which applies heat and pressure to the adhesive of the polyimide 28. The leads 40 of the circuit 26 are wire bonded to the pads of the device 14. As an alternate method, the package 10 may utilize two separate flexible circuits 26 that are initially wire bonded to the device 14 before the circuits 26 are attached to the substrate 16. The wire bonding step of this method may occur before or after the device 14 is mounted to the substrate 16. The flexible circuit 26 is typically tested before the circuit 26 is bonded to the substrate 16.

The substrate 16 may include alignment means such as a pin(s) that aligns the flexible circuit 26 with the substrate 16, so that the leads 40 and pads 12 are assembled in the proper locations. The flexible circuit 26 can be attached to the top surface 20 of the substrate before the circuit 26 is bonded to the device 14, so that the leads 40 remain essentially parallel with the top surface of the device during the wire bonding process. After the device 14 and flexible circuit 26 are attached to the substrate 16, the device 14 is encapsulated with the dielectric material 44.

After the flexible circuit 26 is bonded to the substrate 16, the pads 12 can be formed by placing a solder preform 48 into each hole 46 of the circuit 26. The package is then heated to reflow the solder, so that the solder attaches to the corresponding conductive members 16, 30 or 32. The solder preforms 48 can be placed into the holes with a simple vacuum controlled tooling fixture (not shown). Although the pads 12 are shown and described as being formed after the flexible circuit 26 is assembled to the substrate 16, it is to be understood that the pads 12 could be created during the manufacturing process of the circuit 26. The assembly 10 is typically constructed so that the pads 12 are located throughout the entire bottom surface 22 of the substrate 16, thereby maximizing the pin density of the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method of constructing an electronic assembly, comprising the steps of:
   a) providing a substrate that has a top surface and a bottom surface;
   b) mounting an electrical device to said top surface of said substrate;
   c) attaching leads of a flexible circuit to said electrical device, said flexible circuit having a metal pad;
   d) wrapping said flexible circuit around said substrate such that said metal pad is adjacent to said bottom surface of said substrate; and,
   e) bonding said flexible circuit to said substrate.

2. The method as recited in claim 1, wherein said flexible circuit is wrapped around said substrate before said leads are attached to said electrical device.

3. The method as recited in claim 1, further comprising the step of encapsulating said electrical device with a dielectric material.

4. The method as recited in claim 1, further comprising the step of bonding a portion of said flexible circuit to said top surface of said substrate before said flexible circuit is wrapped around said substrate.

5. A method of constructing an electronic assembly, comprising the steps of:
   a) providing a substrate that has a top surface and a bottom surface;
   b) mounting an electrical device to said top surface of said substrate;
   c) attaching leads of a flexible circuit to said electrical device, said flexible circuit having a hole that provides access to a conductive line that extends from said lead;
   d) wrapping said flexible circuit around said substrate such that said hole is adjacent to said bottom surface of said substrate;
   e) bonding said flexible circuit to said substrate;
   f) placing a solder preform into said hole of said flexible circuit;
   g) heating said solder preform until said solder attains a liquid form; and, h) cooling said solder until said solder attains a solid form.

6. The method as recited in claim 5, wherein said flexible circuit is wrapped around said substrate before said leads are attached to said electrical device.

7. The method as recited in claim 5, further comprising the step of encapsulating said electrical device with a dielectric material.

8. The method as recited in claim 5, further comprising the step of bonding a portion of said flexible circuit to said top surface of said substrate before said flexible circuit is wrapped around said substrate.

* * * * *